United States Patent
Bent et al.

(10) Patent No.: US 8,084,087 B2
(45) Date of Patent: Dec. 27, 2011

(54) FABRICATION METHOD OF SIZE-CONTROLLED, SPATIALLY DISTRIBUTED NANOSTRUCTURES BY ATOMIC LAYER DEPOSITION

(75) Inventors: Stacey F. Bent, Stanford, CA (US);
Rong Chen, Sunnyvale, CA (US);
Xirong Jiang, Stanford, CA (US);
Marja N. Mullings, Stanford, CA (US);
Yuji Saito, Tokyo (JP)

(73) Assignees: The Board of Trustees of the Leland Stanford Junior University, Palo Alto, CA (US); Honda Motor Co., Ltd., Tokyo (JP)

( * ) Notice: Subject to any disclaimer, the term of this patent is extended or adjusted under 35 U.S.C. 154(b) by 978 days.

(21) Appl. No.: 12/070,367

(22) Filed: Feb. 14, 2008

(65) Prior Publication Data
US 2008/0274282 A1 Nov. 6, 2008

Related U.S. Application Data

(60) Provisional application No. 60/901,584, filed on Feb. 14, 2007.

(51) Int. Cl.
*C23C 16/00* (2006.01)
(52) U.S. Cl. ............ 427/255.28; 427/248.1; 427/255.11
(58) Field of Classification Search .................. None
See application file for complete search history.

(56) References Cited

U.S. PATENT DOCUMENTS

| | | | |
|---|---|---|---|
| 2002/0115252 A1* | 8/2002 | Haukka et al. | 438/240 |
| 2004/0214354 A1* | 10/2004 | Marsh et al. | 438/3 |
| 2005/0012099 A1 | 1/2005 | Couillard et al. | |
| 2005/0224779 A1 | 10/2005 | Wang et al. | |
| 2007/0092989 A1* | 4/2007 | Kraus et al. | 438/99 |
| 2007/0108404 A1* | 5/2007 | Stewart et al. | 252/79.1 |

OTHER PUBLICATIONS

Chen, Applied Physics Letters, vol. 84, No. 20, May, 2004.*
Saita et al. Initial Growth Mechanism of Atomic Layer Deposited TiN, May 31, 2004, abstract, Applied Physics Letters, ISSN 00D3-6951 vol. 84, pp. 4571-4573.

* cited by examiner

*Primary Examiner* — Timothy Meeks
*Assistant Examiner* — Joseph Miller, Jr.
(74) *Attorney, Agent, or Firm* — Lumen Patent Firm (57) ABSTRACT

A method of growing spatially-separated and size-controlled particles on substrate surfaces is provided. The method utilizes chemical modification of the substrate surface, an atomic layer deposition (ALD) system, providing a modified layer to the substrate surface and providing an ALD material for nanoparticle deposition. The method induces a Volmer-Weber growth method, where islands of the nanoparticles are formed on the surface. The modified layer controls a number of nucleation sites on the surface, where controlling the number of ALD cycles limits an amount of deposited the material for discrete the nanoparticles. The modified layer can include self-assembled monolayers, modified hydrophobicity of the surface, H-terminated surfaces, and varying functional groups within the modified layer, where thermally attached alkenes, photochemically attached alkenes, thermally attached alkynes or photochemically attached alkynes are attached to the H-terminated surfaces, and the density of the nucleation sites of the nanoparticles are thereby managed.

2 Claims, 11 Drawing Sheets

FABRICATION METHOD OF SIZE-CONTROLLED, SPATIALLY DISTRIBUTED NANOSTRUCTURES BY ATOMIC LAYER DEPOSITION

CROSS-REFERENCE TO RELATED APPLICATIONS

This application is cross-referenced to and claims the benefit from U.S. Provisional Patent Application 60/901,584 filed Feb. 14, 2007, which is hereby incorporated by reference.

FIELD OF THE INVENTION

The invention relates generally to fabrication methods of nanostructures, including nanoparticles, nanodots, nanowires and nanorods. More particularly, the invention relates to fabrication methods with controllable size and spacing on a variety of substrates and substrate geometries using atomic layer deposition.

BACKGROUND

Figure 1:
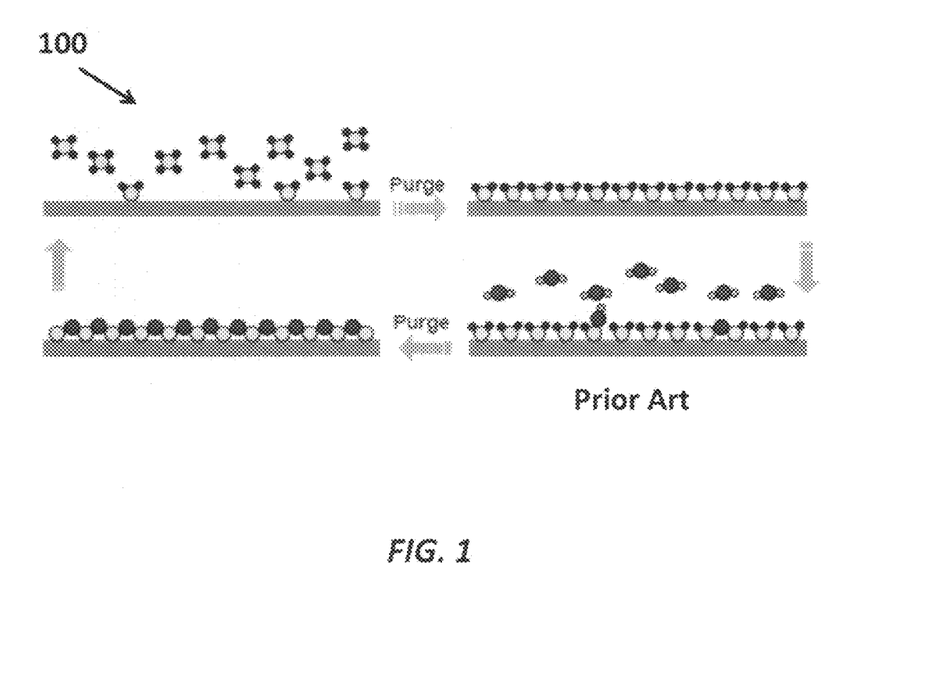
FIG. 1 shows schematic drawing of a prior art ALD process.

Atomic layer deposition (ALD) is a process for depositing highly uniform and conformal thin films by alternating exposures of a surface to vapors of two chemical reactants. For example, it is useful for depositing high-permittivity metal oxide dielectrics such as $ZrO_2$ or $HfO_2$ to replace $SiO_2$ in future generation metal-oxide-silicon (MOS) transistors. Other applications include luminescent materials for photonics, thin film phosphors for electroluminescent displays, and catalysts for fuel cells. A prior art ALD process 100 is shown in the schematic drawing of FIG. 1. It consists of an alternating series of self-limiting chemical reactions, called half-reactions, between gas phase precursors and the substrate. The precursors are pulsed into the reactor in a sequential fashion. Between each half-reaction, an inert gas flow is used to purge the growth chamber of the previous precursor species. ALD processes are typically performed at modest temperatures (300-600° K). The material grows at a rate of up to one monolayer at a time, and depositions of ~1 Å per cycle, and cycle times of 1-100 sec. are typical. Consequently, it is most useful for deposition of film structures with a total thickness of ~50 nm or less.

Nanomaterials such as nanoparticles are of interest for many applications, including as optical tags and sensors, as lasers, in photovoltaics, in molecular electronics, in photonics, and as catalysts. For many applications, it is not just the synthesis, but the assembly or distribution of the nanoparticles or nanomaterials that is important. For example, for heterogeneous catalysis it is desirable that the nanoparticles be dispersed throughout a high surface area support to have a high number of active sites. In fuel cell applications, dispersed nanoparticle catalysts or catalysts distributed in a mesh structure will allow reduction of the noble metal loading (reduced cost), and increase in the triple-phase boundary (increased efficiency). Nanoparticle dispersion can also lead to high sensitivity in sensor applications. Similarly, for metal nanoparticles used as the catalysts in nanotube or nanowire growth, distributing the nanoparticles spatially on a planar substrate can lead to assembled and oriented nanotubes or nanowires. Although there are many techniques available for synthesizing nanoparticles and other nanoscale objects, there is still an important need for methods that control both the particle size and the distribution of the nanoparticles in two or three dimensions. In addition, techniques that can deposit nanoparticles and other nanoscale objects uniformly throughout a porous substrate are key to many applications in catalysis and sensing.

Nanoparticles have been synthesized by a variety of methods. The most common method of producing them makes use of colloidal chemistry. Metal nanoparticles can be produced in solution by the reduction of a suitable salt in the presence of a stabilizer. Another preparation method is the thermal decomposition of organometallic precursor of various metals in the presence of suitable surfactants. Additionally, vaporization of the material followed by deposition onto a cold substrate or inside walls of vacuum chamber has been successfully carried out. A related method is the laser ablation technique in which nanoparticles are generated by irradiation of a solid target by a focused ion beam under inert conditions and then deposited on cold substrates. A number of gas phase deposition techniques have been employed as well. Semiconductor nanoparticles have been synthesized in large quantities using these methods. Furthermore, anatase titania nanoparticles have been prepared by metalorganic chemical vapor deposition. All of the aforementioned techniques have lacked control of the size and spacing of the desired nanoparticles.

Accordingly, there is a need to develop method for growing nanoparticles on both flat and structured surfaces in which the size and average spacing of the nanoparticles can be controlled.

SUMMARY OF THE INVENTION

To address the shortcomings in the art described above, the current invention is a method of growing spatially-separated and size-controlled particles on substrate surfaces. The method utilizes chemical modification of the substrate surface using an atomic layer deposition (ALD) system, providing a modified layer to the substrate surface and providing an ALD material for nanoparticle deposition. The method induces a Volmer-Weber growth method, where islands of the nanoparticles are formed on the surface. The modified layer controls a number of nucleation sites on the surface, where controlling the number of ALD cycles limits an amount of deposited material for discrete nanoparticles.

In one aspect of the invention, the modified layer can include self-assembled monolayers (SAM), modified hydrophobicity of the surface, H-terminated surfaces, and varying functional groups within the modified layer, where thermally attached alkenes, photochemically attached alkenes, thermally attached alkynes or photochemically attached alkynes are attached to the H-terminated surfaces, and the density of the nucleation sites of the nanoparticles are thereby managed. Further, the SAM can include octadecyltrichlorosilane (ODTS), linear aliphatic alkyltrichlorosilanes of different chain lengths, molecules with different reactive head groups and molecules with different tail group types. The reactive head group molecules include monohalosilanes, dihalosilanes and trihalosilanes, where the head of the SAM is managed according to a head group, and the head group is controlled according to formation time. Additionally, the H-terminated surface can be a hydrosilylation surface, where the number of nucleation sites on the surface are controlled by varying the formation time and the tail groups. The SAM film can have a formation time ranging from 5 seconds to 10 days.

In a further aspect of the invention, the SAM can be applied in a process phase such as vapor phase, solution phase, or soft lithographic printing phase.

In a further aspect, the tail groups can include linear tails, branched tails or aromatic tails, where the density of the nucleation sites of the nanoparticles can be managed according to the tail group and formation time. Here, the SAM tail length or structure can have a formation time ranging from 5 seconds to 10 days.

In another aspect of the invention the hydrophobicity can have a water contact angle range from 5 degrees to 180 degrees. The hydrophobicity range can be controlled using HF etching or any chemical pretreatment that affect a density of surface hydroxyl groups, where the hydrophobicity level provides the growth range of the ALD material from conformal films to discrete nanoparticles.

According to one aspect of the invention, the ALD material can be a conductor, semiconductor, insulator, catalyst or photo-catalyst.

In a further aspect of the invention, the substrate surface may be patterned, where area selective ALD can be used to create a spatial pattern of domains of the nanoparticles.

In yet another aspect, the substrate surface can be porous, where the porous substrate can include aerogels, anodic alumina or other porous media.

In a further aspect, the replacement precursor envelopes the ALD material, where the enveloped ALD material includes layered nanoparticles.

In one aspect of the invention, the ALD system has reactor parameters that include reactor temperature, substrate temperature, source temperature, precursor pulse time, inert purge time, and number of cycles, where the system parameters are varied to optimize the nanoparticle size and density.

In one embodiment, the modified substrate layer can be a mesh structure, where the mesh structure includes bare nano-size openings in the modified substrate layer. The openings can include through-holes, pores or reactive sites. The mesh can be created by using microcontact printing to provide a pattern of terminated SAMs, and the terminated SAMs can include —$CH_3$ and —OH groups, where the ALD growth on the surface does not occur on the mesh structure.

According to one aspect of the current embodiment, the mesh can be created by using an ALD passivator to the modified surface and providing an ALD-deposited sacrificial material layer to the ALD passivator, where islands are created thereon. The passivator is removed and an ALD layer is provided to the sacrificial layer, and the sacrificial layer is removed, where the mesh structure is created and the feature size of the mesh structure is managed according to hydrophobicity, formation time, composition of the SAM or temperature.

Some key advantages of the current invention include use of vapor phase method for synthesis of nanoparticles and other nanoscale objects with control over size and average spacing. These aspects eliminate the need for a surface capping layer or other stabilization layer on the nanoparticles. The method can be used on highly porous substrates. The ALD-based method allows size and dispersion-controlled nanoparticles to be controllably deposited in complex, porous or highly structured substrates. Catalyst geometry is enhanced by controlling the porosity of the material or the feature size of the film's mesh structure, for catalytic applications. A reduced catalyst loading is provided by controlling the size and distribution of the catalyst. Material selection can be broad, since ALD can be used to deposit range of materials, including conductors, semiconductors, insulators, catalysts and photo-catalysts, and the choice of substrate material is also broad.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

Figure 2:
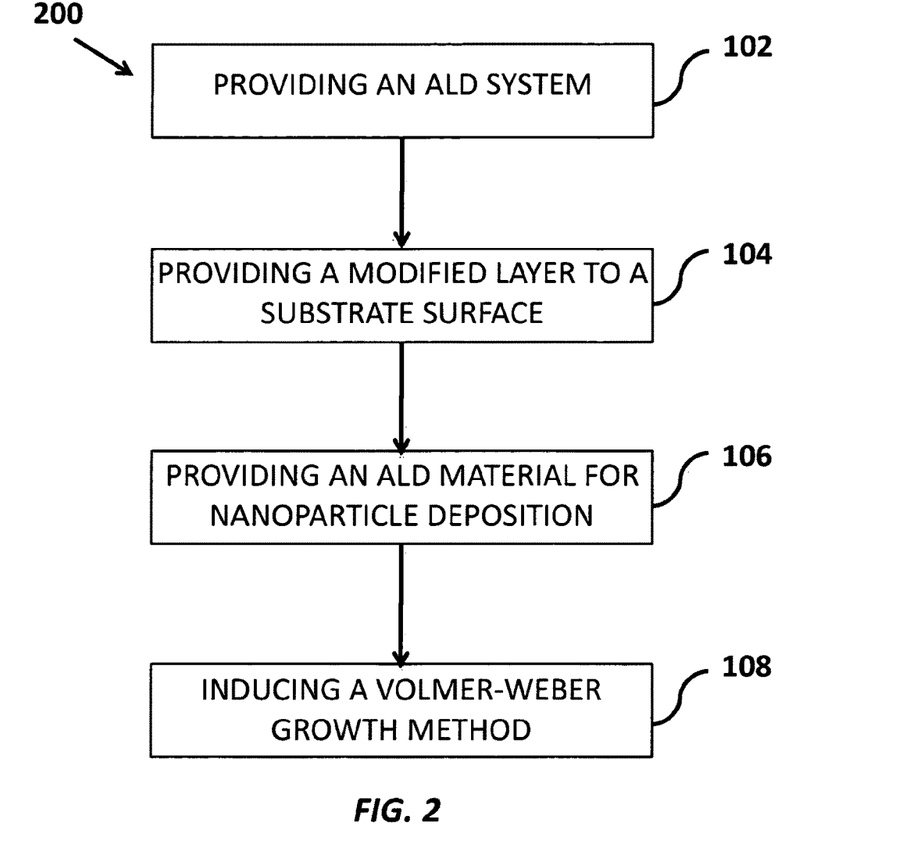
FIG. 2 shows a flow diagram showing the steps of the method for growing nanoparticles on both flat and highly structured surfaces in which the size and average spacing of the nanoparticles can be controlled according to the current invention.

FIG. 2 is a flow diagram showing the steps of the method for growing nanoparticles 200 on both flat and highly structured surfaces in which the size and average spacing of the nanoparticles can be controlled, according to the current invention. The method 200 includes using an atomic layer deposition (ALD) system 202, providing a modified layer to the substrate surface 204 and providing an ALD material for nanoparticle deposition 206. The method induces a Volmer-Weber growth method 208, where islands of the nanoparticles are formed on the surface. The modified layer controls a number of nucleation sites on the surface, where controlling the number of ALD cycles limits an amount of deposited the material for discrete the nanoparticles.

ALD is an enabling technology for the fabrication of the size-controlled, spatially distributed nanoparticles. The surface chemistry and choice of molecular precursors used in ALD are responsible not only for its self-limiting nature but also for the nucleation process. The starting chemistry of the substrate surface is critical for initiation of ALD film growth, according to the current invention. In deposition of metal oxide layers on Si substrates, for example, a hydroxylated $SiO_2$ surface encourages ALD of very uniform films, whereas HF-last (100) Si surfaces cause growth of defective films because of sporadic nucleation. This nucleation process is manipulated by chemical functionalization. Control of the nucleation sites is used to produce nanoparticles. There are a number of advantages of the ALD-based nanoparticle fabrication method of the current invention. One major advantage is that ALD is well suited for use with high aspect ratio or highly porous substrates, enabling the uniform infiltration of high surface area materials such as aerogels. The ALD nucleation process can be controlled by the use of a surface functionalization layer. The substrate properties may be adjusted to enable the deposition of nanoparticles having controlled size and spacing. The invention also allows for the use of the area-selective ALD processes developed to create spatial patterns of nanoparticle domains.

In one aspect of the invention, the ALD system has reactor parameters that include reactor temperature, substrate temperature, source temperature, precursor pulse time, inert purge time, and number of cycles, where the system parameters are varied to optimize the nanoparticle size and density.

As described above, the ALD process consists of an alternating series of self-limiting chemical reactions between gas phase precursors and the substrate. The adsorption-controlled layer-by-layer reactions characteristic of ALD typically allow for the precise control of film thickness and uniformity over large areas. For conformal film growth, it is desirable to have many nucleation sites at the growth surface. Conversely, the chemical properties of the substrate surface can be used to constrain the ALD nucleation process to obtain growth of particles rather than a continuous film; these are key aspects to the current invention. The chemical properties of the substrate surface can greatly influence the ALD nucleation process. There exists a strong dependence of the morphology of the deposited film on surface functionalization.

According to the current invention, the ALD process is converted from a controlled-thickness thin film deposition process to a method of depositing nanoparticles having controlled size and spacing by using surface chemical modification. The types of nanoparticles can include, but are not limited to Pt, Cu, $TiO_2$, $HfO_2$, Ru, Ni, Mo, ZnS, GaAs, $CuInSe_2$, InP, $SnO_2$, MgO, NiO, etc., where the method is generally applicable to most other materials that can be deposited by ALD. According to one aspect of the invention, the ALD material can be a conductor, semiconductor, insulator, catalyst or photo-catalyst.

Important factors determine the capacity of self-assembled monolayers to prevent ALD of $HfO_2$ and other materials, these include chain length, tail group structure, and reactive head group. According to the current invention, in order to achieve desired deactivation, the method forms densely packed, highly hydrophobic, organic monolayers. The method includes using deactivating agents with high reactivity and non-bulky tail groups having minimum chain length. In one aspect, the tail groups can include linear tails, branched tails or aromatic tails, where the density of the nucleation sites of the nanoparticles can be managed according to the tail group and formation time. Here, the SAM tail length or structure can have a formation time ranging from 5 seconds to 10 days.

Figure 3:
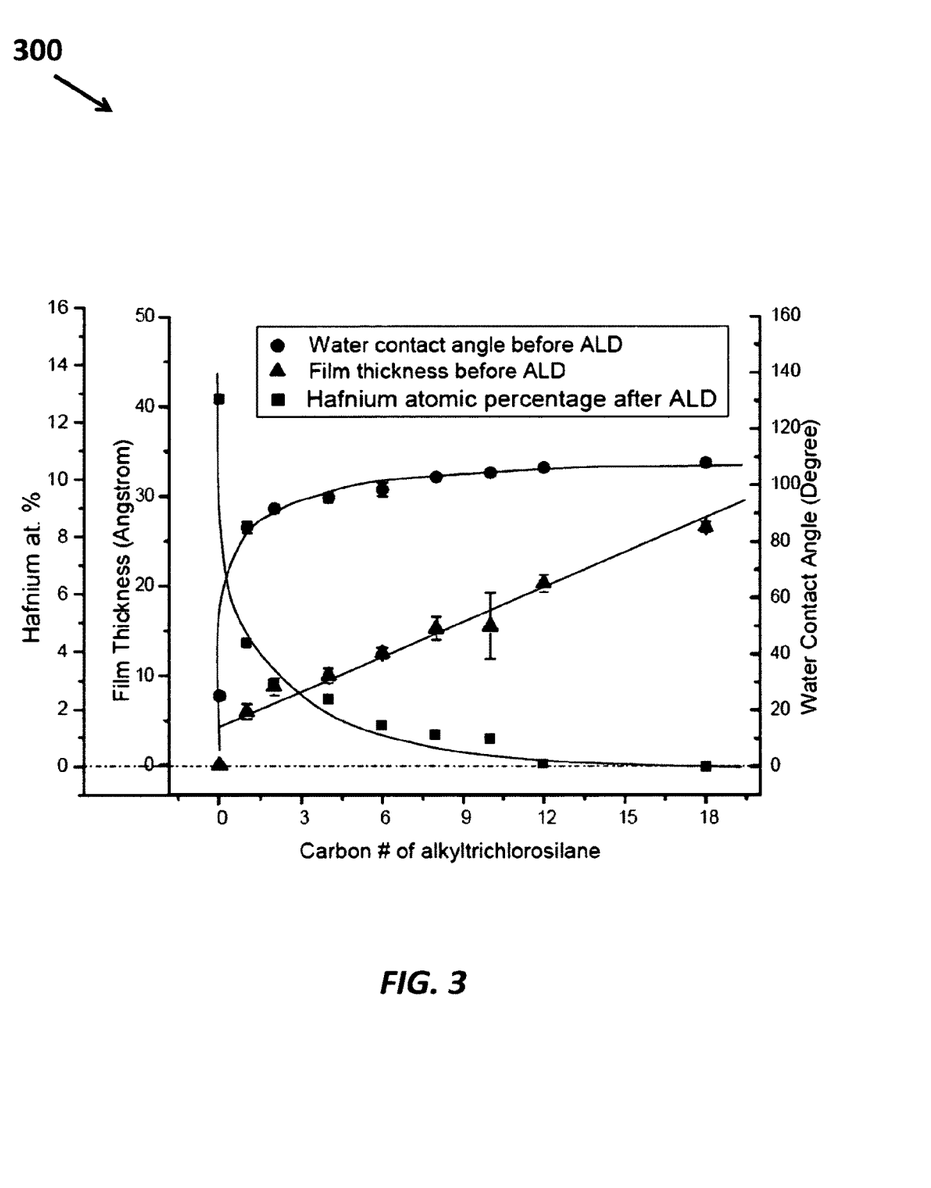
FIG. 3 shows a graph of the chain length dependence for the deactivation efficiency for linear SAMs, as measured in Hf atomic percentage according to the current invention.
Figure 4:
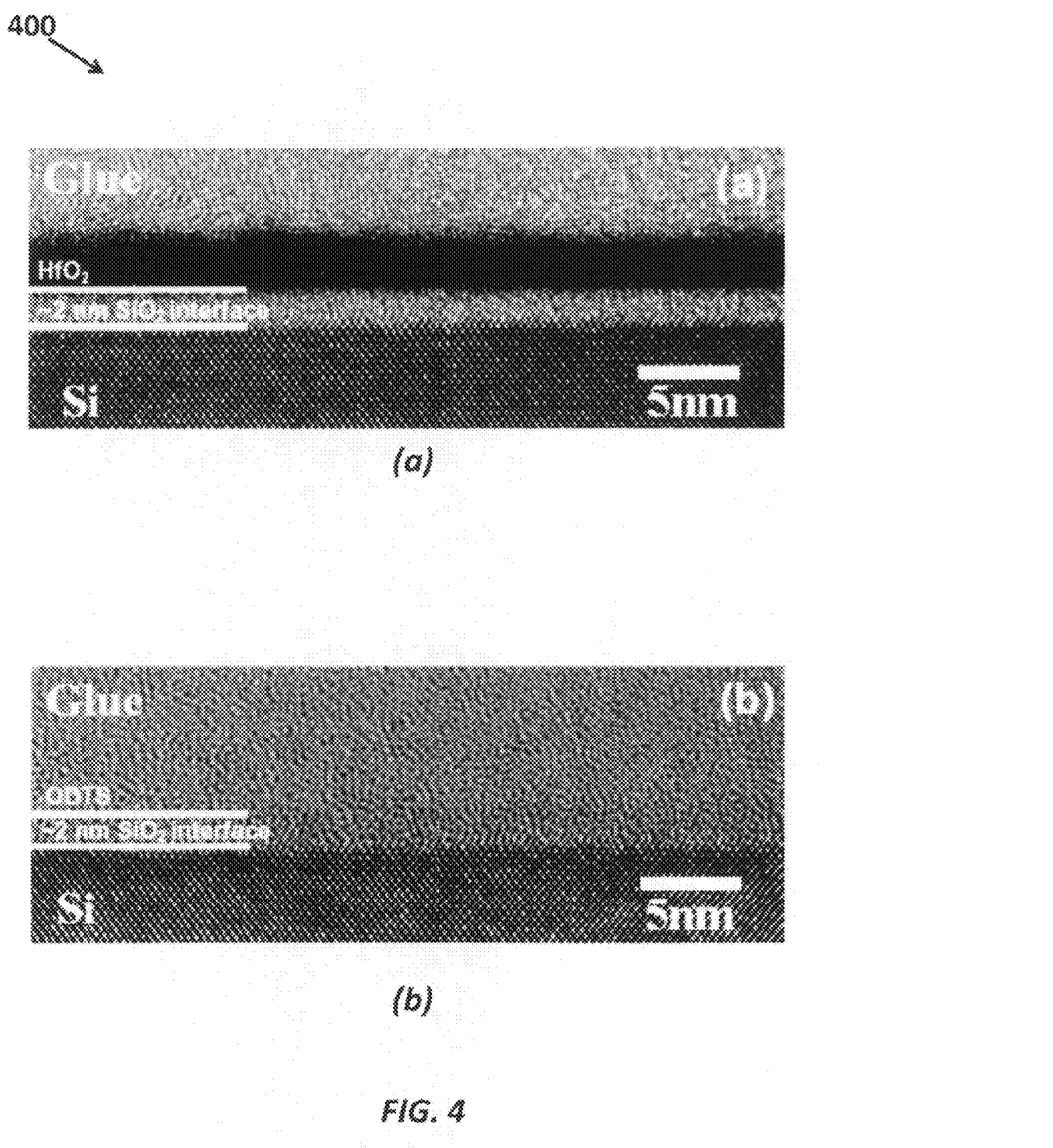
FIGS. 4(a)-4(b) show TEM images of the substrate after 50 cycles of $HfO_2$ ALD for an unprotected surface and a surface deactivated with ODTS, respectively, according to the current invention.

An example of chain length dependence for the deactivation efficiency for linear SAMs, as measured in Hf atomic percentage 300 is shown in the graph of FIG. 3. As shown, only at chain lengths above 12 carbon atoms is the ALD process stopped completely. FIGS. 4(a) and 4(b) show TEM images 400 of a substrate after 50 cycles of $HfO_2$ ALD for an unprotected surface in FIG. 4(a) and a surface deactivated with ODTS in FIG. 4(b). The well-packed long chain SAM completely blocks the $HfO_2$ ALD process. According to the invention the SAM both removes reactive SiOH/Si—O—Si groups at the $SiO_2$ surface and prevents ALD precursors from reaching the $SiO_2$—SAMs interface. At shorter chain lengths, or for less well-packed monolayers, ALD growth does occur but in particulate form rather than as a continuous film.

Figure 5:
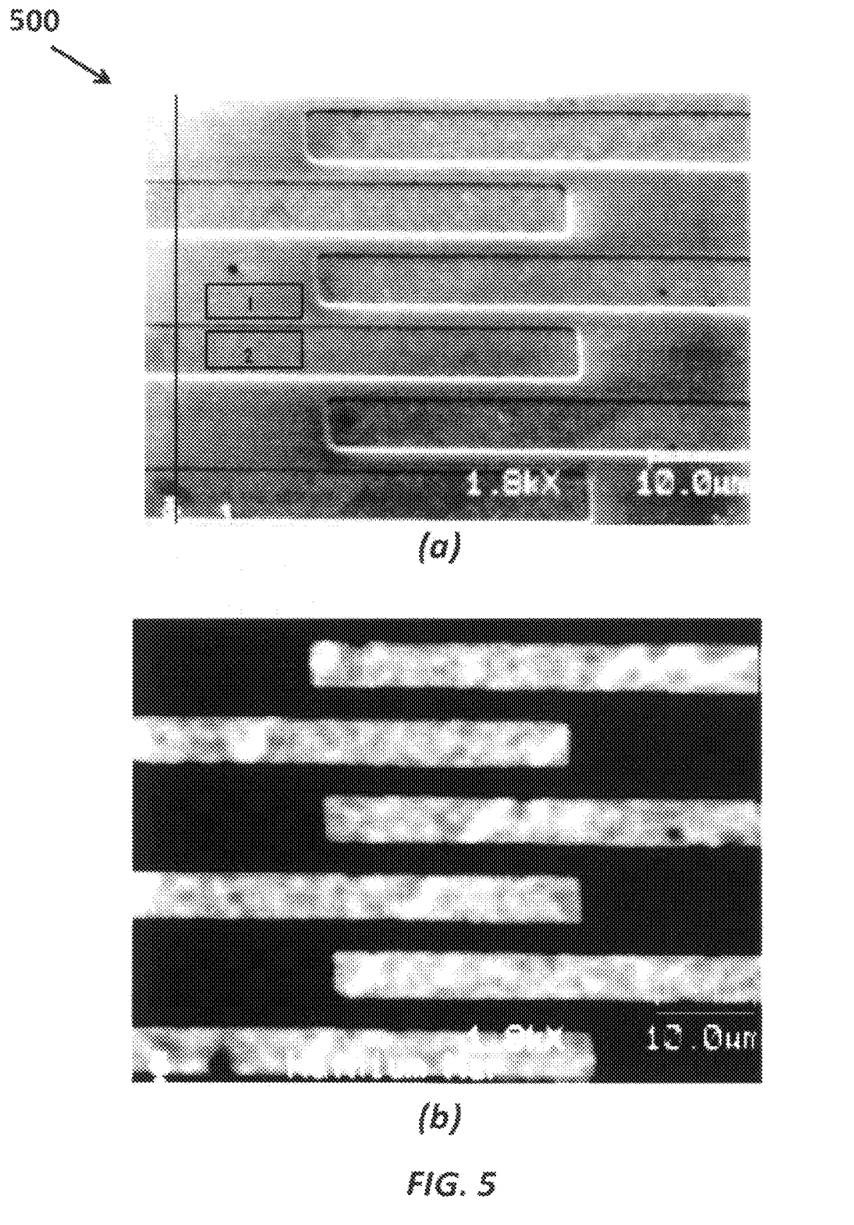
FIGS. 5(a)-5(c) show Hf elemental mapping analysis using Auger electron spectroscopy (AES) after the area selective ALD process according to the current invention.

Using the method of the current invention to optimize the SAM resists, high-resolution area-selective atomic layer deposition is achieved using a chemical selective process. By utilizing the intrinsically selective absorption behavior of the SA on different surfaces, an octadecyltrichlorosilane (ODTS) SAM can be used to deactivate the oxide regions on a patterned silicon substrate while leaving areas of hydride-terminated silicon intact. For example, an $HfO_2$ thin film was selectively deposited onto the hydride terminated silicon regions by atomic layer deposition. The results shown in FIGS. 5(a)-5(c) demonstrate that the process has excellent area selectivity and forms $HfO_2$ patterns with high spatial resolution. FIGS. 5(a)-5(c) show Hf elemental mapping analysis 500 using Auger electron spectroscopy (AES) after the area selective ALD process; a well-defined $HfO_2$ pattern which is the reverse of the underlying $SiO_2$ pattern. FIG. 5(a) shows scanning electron microscopy (SEM) image of patterned area; the region marked 1 is $SiO_2$ coated, while that marked 2 is unoxidized Si. FIG. 5(b) shows Hf elemental mapping by AES, and FIG. 5(c) shows AES-defined linescan.

Figure 6:
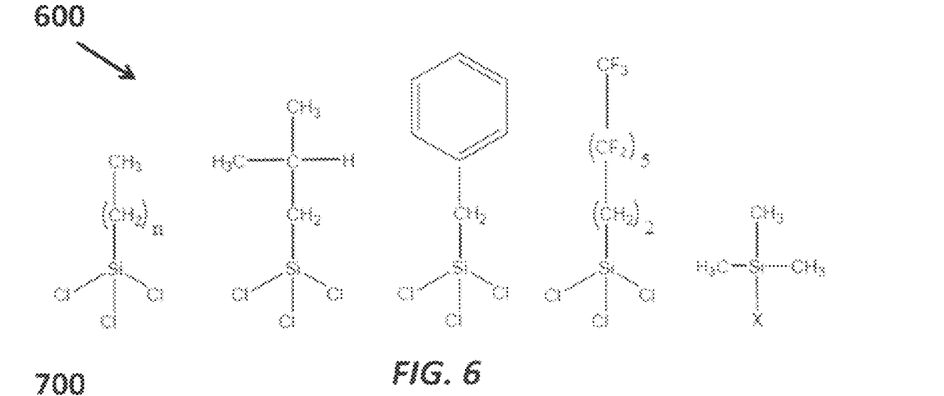
FIG. 6 shows some examples of molecular precursors according to the present invention.

Some of the SAM precursors include linear aliphatic alkyltrichlorosilanes of different chain lengths; trichlorosilanes with different tail group types, including linear, branched, or aromatic tails; and molecules with different reactive head groups, such as mono-, di-, and trihalosilanes. Some examples of molecular precursors 600 are shown in FIG. 6. In one aspect of the invention, the modified layer can include modified hydrophobicity of the surface, H-terminated surfaces, and varying functional groups within the modified layer, where thermally attached alkenes, photochemically attached alkenes, thermally attached alkynes or photochemically attached alkynes are attached to the H-terminated surfaces, and the density of the nucleation sites of the nanoparticles are thereby managed. Further, the SAM can include ODTS, linear aliphatic alkyltrichlorosilanes of different chain lengths, molecules with different reactive head groups and molecules with different tail group types. The reactive head group molecules include monohalosilanes, dihalosilanes and trihalosilanes, where the head of the SAM is managed according to a head group, and the head group is controlled according to formation time. Beyond halosilane head groups, a functional group such as methoxy may be used. Additionally, the H-terminated surface can be a hydrosilation surface, where the number of nucleation sites on the surface are controlled by varying the formation time and the tail groups. The SAM head structure can have a formation time ranging from 5 seconds to 10 days.

In a further aspect of the invention, the SAM can be applied in a process phase such as vapor phase, solution phase, or soft lithographic printing phase.

The degree of hydrophobicity and thickness are two characteristics that correlate with the quality of the SAM. Lower hydrophobicity can indicate a more porous (less dense) film with more possible routes for nucleation at the substrate.

In addition to SAMs, other surface modifications are embodied in the current invention. Hydrogen termination (H-termination) can alter the nucleation process of Pt ALD, for example. The degree of hydrophobicity can also be controlled in oxide substrates by different chemical pretreatments, which affect the density of surface hydroxyl groups. The hydrophobicity, in turn, allows tunability of the surface from an active surface to an inhibitory surface 700, as shown in the schematic drawing of FIG. 7, leading to a growth range from conformal films to discrete nanoparticles. In another aspect of the invention the hydrophobicity can have a water contact angle range from 5 degrees to 180 degrees. The hydrophobicity range can be controlled using HF etching or any chemical pretreatment which affect a density of surface hydroxyl groups, where the hydrophobicity level provides the growth range of the ALD material from conformal films to discrete nanoparticles.

There are three stages in any kind of thin film growth, including ALD. These stages are nucleation, coalescence, and steady-state growth. Nucleation is a non-equilibrium process that takes place at high supersaturation. Thin film growth occurs by the formation of nuclei and their growth. Nucleation can occur in any of three classical growth modes: layer by layer (Frank-van der Merwe), island type (Volmer-Weber), or layer-plus-island (Stranski-Krastanov) growth. In the Frank-van der Merwe mode of two-dimensional growth, layers grow upon layers. This is governed by the fact that the interaction energy between the film and substrate atoms is greater than that between film atoms themselves. In the Volmer-Weber mode, formation of three-dimensional islands form on the substrate. This occurs because the interaction energy between the film and substrate atoms is smaller than between film atoms. In the Stranski-Krastanov mode, island growth occurs after the formation of one or two monolayers. Layer-plus-island growth occurs when interface energy rises with film thickness. A further step in three-dimensional thin film growth is enlargement of islands until they finally coalesce to form a continuous film. This process determines the minimum achievable continuous film thickness (typically 1-20 nm), which in turn is controlled by the surface energies and supersaturation through surface and bulk diffusion. Further deposition of atoms leads to increase in film thickness. The roughness of the film varies from material to material, determined by the diffusion kinetics of its atoms.

Figure 7:
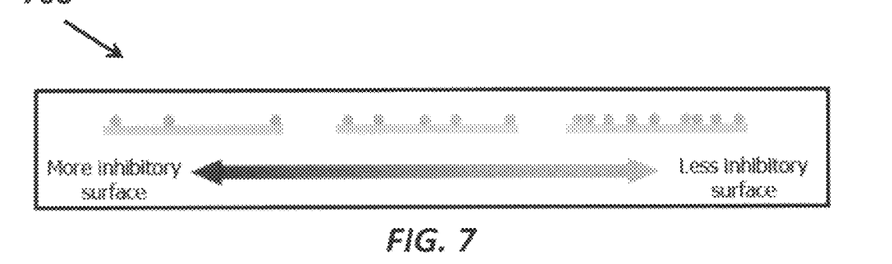
FIG. 7 shows the tunability of the surface from an active surface to an inhibitory surface according to the current invention.
Figure 8:
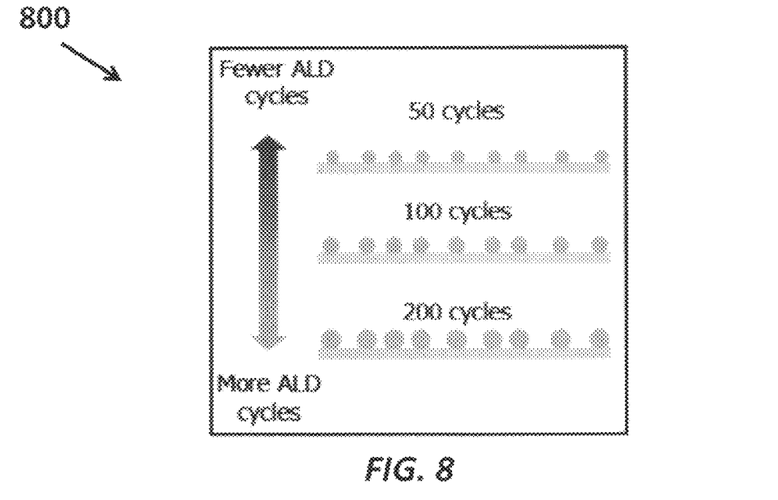
FIG. 8 a schematic drawing of how size of the nanoparticles can be controlled independently by selecting the number of ALD cycles according to the current invention.

In the current invention, the surface chemical properties are prepared such that the Volmer-Weber growth occurs, leading to formation of particles (islands). By controlling the number of ALD cycles, the amount of material deposited can be limited to below the coalescence point, retaining discrete nanoparticles. The surface functionality and the number of ALD cycles to control both the size and average spacing of the deposited nanoparticles are controlled. By using different surface modifications, including formation of self-assembled monolayers, change of hydrophobicity, and variation of functional groups, the density of the nucleation sites is limited in the ALD process to control the areal density of the nanoparticles; a more inhibitory surface will lead to fewer nucleation sites and a lower density of nanoparticles, while a less inhibitory surface will lead to a higher density of nanoparticles, as illustrated in FIG. 7. The size of the nanoparticles can, in turn, be controlled independently by selecting the number of ALD cycles 800, as shown in FIG. 8.

In one aspect of the invention, surface functionalization is used to control the number of nucleation sites, which in turn influences the deposition process, leading to discrete particle growth. Because ALD is uniquely suited for such a process, depositing numerous semiconducting, insulating and metallic materials with excellent conformality and precise control of the deposition rate is possible. ALD is used to deposit a wide range of materials including semiconductors such as Si and GaAs, metal oxides such as $HfO_2$ and $TiO_2$, and metals such as Pt and Cu. It can be used to deposit polycrystalline and amorphous layers in addition to epitaxial thin films.

Figure 9:
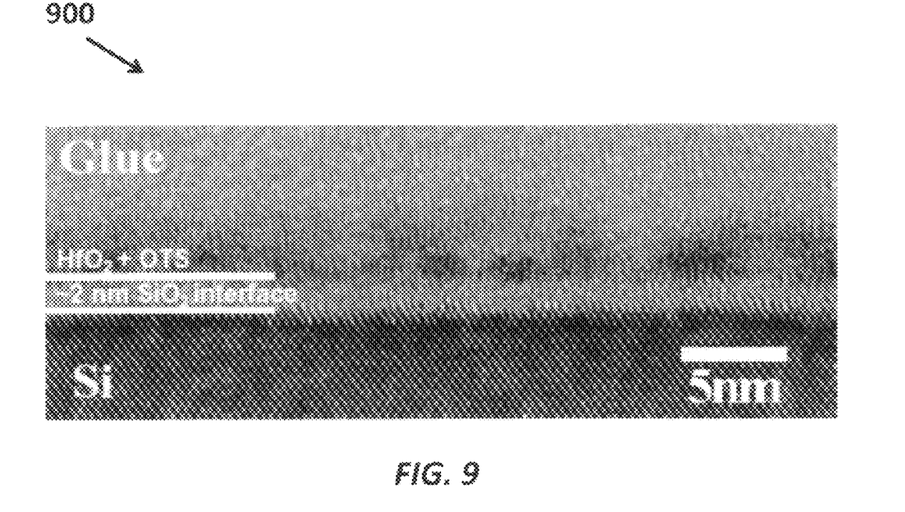
FIG. 9 shows a cross-sectional TEM image of $HfO_2$ nanoparticles that were deposited by ALD on a surface coated with an octyltrichlorosilane (OTS) selfassembled monolayer (SAM), according to the current invention.

FIG. 9 shows a cross-sectional TEM image 900 of HfO2 nanoparticles that were deposited by ALD on a surface coated with an octyltrichlorosilane (OTS) selfassembled monolayer (SAM). Note the particulate $HfO_2$ growth achieved in the OTS system. On a clean surface, without functionalization, the same ALD process led to a continuous, conformal $HfO_2$ film (see FIG. 4a). Conversely, a longer chain ODTS SAM prevented ALD completely (see FIG. 4b). Therefore, OTS functionalization forces ALD growth to occur in discrete particles rather than as a continuous film. In this case, the shorter chain SAM has inhibited, but not completely blocked, ALD by reducing the number of nucleation sites. Loosely packed SAMs (formed with shorter treatment times) also have a similar effect. Hence, the morphology of the deposited material is controlled by changing the surface functionality.

Figure 10:
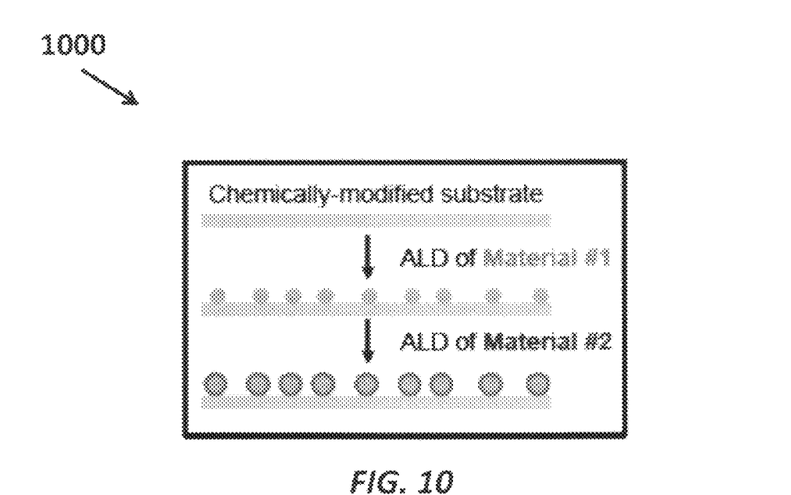
FIG. 10 shows a schematic drawing of how the ALD process can be switched in situ to different ALD precursors, allowing growth of an outer shell of a second material according to the current invention.

Greater overall control is achieved by combining the cycle number tunability with the ability to manipulate the density of nucleation sites chemically. Once the density of nucleation sites has been restricted at the substrate, an increased number of ALD cycles continue growth of the already-nucleated particles. In addition to depositing elemental and compound materials, the current invention allows for the fabrication of layered nanoparticles. In a further aspect, the replacement precursor envelopes the ALD material, where the enveloped ALD material includes layered nanoparticles. Following formation of distributed nanoparticles of a specified size from one material, the ALD process can be switched in situ to different ALD precursors, allowing growth of an outer shell of a second material 1000, as shown in FIG. 10.

Figure 11:
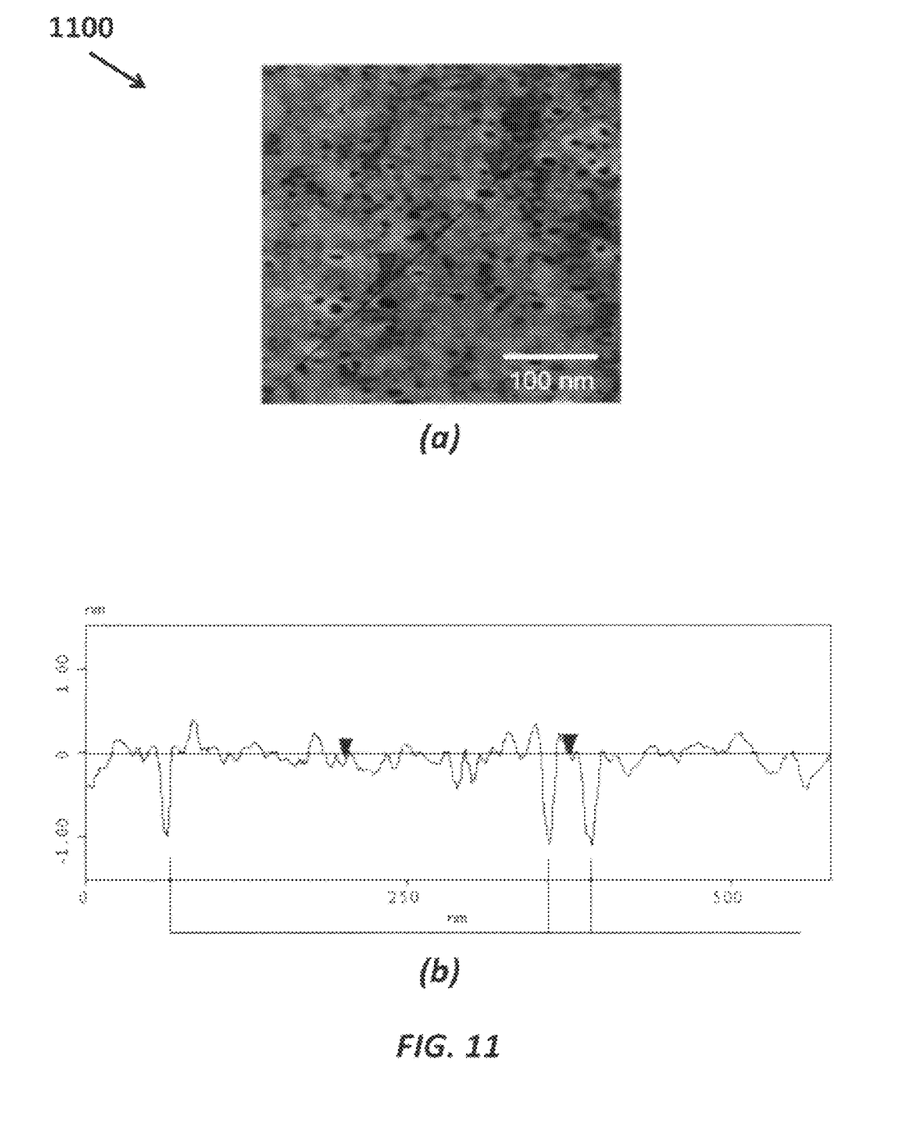
FIGS. 11(a)-11(b) show imperfect SAMs that leave pinholes in the layer which give access to surface nucleation sites according to the present invention.
Figure 12:
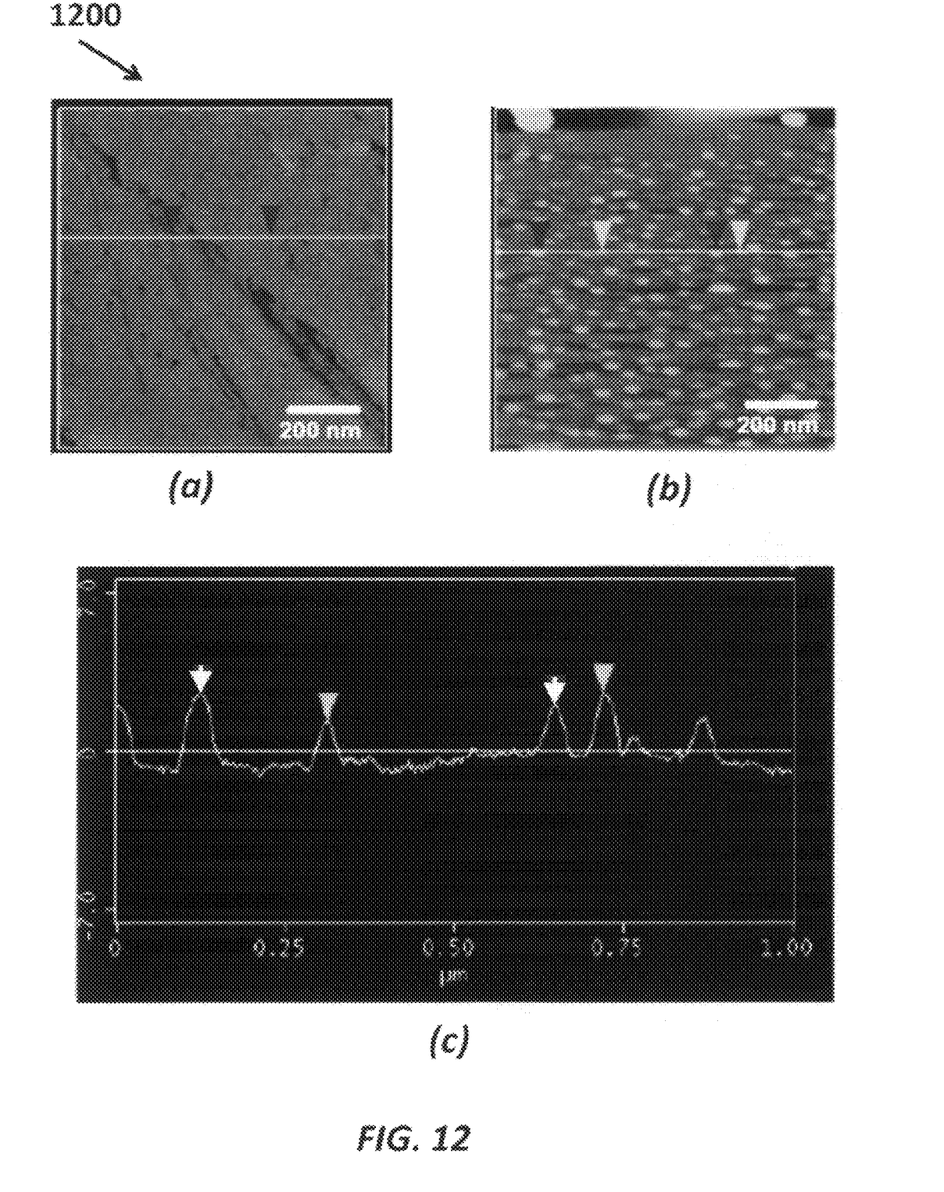
FIGS. 12(a)-12(c) show the results of the Pt ALD process according to the present invention.

Deposition of exemplary nanoparticles of platinum, copper, titania, and hafnia on modified surfaces demonstrate the aspects of the current invention (see FIGS. 11 and 12). Platinum and copper are both catalytic metals, and exhibit interesting properties at the nanoscale. Hafnia is an insulator with a high dielectric constant. Titania is of interest for a number of applications, including for use as a photocatalyst and in optics and electronics. By examining both $TiO_2$ and Pt, this approach to is useful to develop highly dispersed $TiO_2$/Pt nanoparticle photocatalysts. In addition to their practical uses, the choice of these materials systems allows comparison of different fundamental classes of ALD systems—elemental versus binary, metal versus oxide, conductor versus semiconductor. Furthermore, the applicability of the current invention is demonstrated with materials that naturally tend toward island growth (Pt) versus those that more readily growth by the layer-by-layer mode in ALD ($HfO_2$ or $TiO_2$). A system like $HfO_2$ that favors conformal growth requires more careful surface modification to achieve nanoparticle deposition; however, even these systems can be converted to an island growth mode for production of nanoparticles.

The variety of ALD chemistries that have been developed over the years allow for the growth of many different materials and there are a number of possible ALD schemes for the deposited materials. $HfO_2$ can be deposited by several precursors, including $HfCl_4$ plus $H_2O$, as well as tetrakis(dimethylamido)hafnium(IV) ($Hf[N(CH_3)_2]_4$) plus $H_2O$. The Pt ALD process includes two self-limiting chemical reactions, repeated in alternating ABAB sequences shown below:

$$Pt(s)+O2(g) \rightarrow Pt-Ox \qquad\qquad A$$

$$CH3C5H4Pt(CH3)3+Pt-Ox \rightarrow Pt(s)+CO2(g)\uparrow+H2O$$
$$(g)\uparrow+\text{other byproducts}\uparrow, \qquad\qquad B$$

where the (methylcylopentadienyl)trimethylplatinum and the oxygen are delivered in separate pulses. For deposition of $TiO_2$, ALD can be carried out using $TiCl_4$ plus $H_2O$. Copper ALD has been achieved using a variety of precursors, including CuCl and Zn, CuCl and $H_2O$, CuCl with $H_2$ and $H_2O$, $Cu(hfac)_2$ and isopropanol, and copper(I) amidinates plus $H_2$. The process of the current invention can be extendable to a large number of nanoparticle materials. The initial nucleation sites depend on the specific ALD process, where although surface hydroxyl groups appear to be the most effective nucleation sites for growth, $HfO_2$ will nucleate on a number of substrate surfaces, including $SiO_2$ and HF-etched (H-terminated) Si. On the other hand, Pt, while nucleating well on oxides such as $SiO_2$, does not deposit well on H-terminated Si. Effectively, Pt ALD exhibits a much longer incubation time than $HfO_2$ ALD on the same surface. The incubation period is a period of slow growth prior to commencement of the linear ALD regime, and it has been tied to the availability (or lack) of nucleation sites. Consequently, different surface functionalizations are useful for controlling ALD growth in different materials systems. In the current invention, SAMs are a key method for modifying the chemical properties of an oxide surface (e.g. $SiO_2$ on Si) and, in particular, controlling the density of nucleation sites. SAMs interfere with the ALD process through a dual mechanism: 1) the head groups react with active sites (e.g. —OH) on the substrate, removing them from ALD chemistry, and 2) the packed hydrophobic tails prevent ALD precursors from accessing any remaining reactive sites at the substrate without contributing any active functionalities themselves. Importantly, the current invention provides imperfect SAMs that leave pinholes in the layer which give access to surface nucleation sites 1100, as shown in FIGS. 11(*a*) and 11(*b*). FIG. 11(*a*) shows an atomic force microscopy (AFM) image of a loosely packed ODTS SAM, revealing the presence of pinholes. These pinholes allow ALD precursors access to the surface, leading to nucleation and growth of particles. The SAM was formed in a loosely packed state by intentionally using insufficient formation time. FIG. 11(*b*) shows a line-scan of the surface topography of the ODTS SAM. The density of these pinholes controls the density of nucleation sites and hence the density of the resulting nanoparticles deposited. The density of the pinholes or other nucleation sites can be controlled by a number of factors, including length of time that SAM is allowed to form, length of the tail on the SAM molecules, and structure of the head and tail groups of the SAM.

For an ALD system, different reactor parameters can be varied, including reactor and substrate temperature, precursor pulse time, inert purge time, and number of cycles. Each of these parameters affects the ALD process. The parameters are tuned to define the ALD process window. For nanoparticle deposition on functionalized surfaces, all the parameters need to be considered, as they may also influence particle density and size according to the current invention.

An exemplary $SiO_2$ surface has been chemically modified with a "loosely packed" ODTS SAM formed using short immersion time 1200, as shown in FIG. 12. This sample was then loaded into the ALD reactor, together with a control sample of unmodified $SiO_2$, for the Pt ALD process. FIGS. 12(*a*)-12(*c*) show the results of the Pt ALD process. Here AFM images following Pt ALD (FIG. 12(*a*)), for an unmodified $SiO_2$ substrate and (FIG. 12(*b*)) $SiO_2$ covered with a loosely packed ODTS SAM. FIG. 12(*c*) shows a linescan of the AFM image in FIG. 12(*b*), with the vertical scale in nm. Discrete nanoparticles can be clearly observed. The ALD conditions were: 290° C. substrate temperature; 2 sec. precursor dose times and 20 sec. purge times; 60 cycles.

Although the film on the unmodified surface is relatively smooth (see FIG. 12(*a*)), the modified substrate resulted in the deposition of discrete nanoparticles (see FIGS. 12(*b*) and (*c*)). The particle size distribution is relatively narrow following 60 Pt ALD cycles. Further tuning of the SAM properties and the ALD cycle number can allow a range of areal densities and nanoparticle sizes to be selected according to the method of the current invention.

In one embodiment, the modified substrate layer can be a mesh structure, where the mesh structure includes bare nano-size openings in the modified substrate layer. The openings can include through-holes, pores or reactive sites. The mesh can be created by using microcontact printing to provide a pattern of terminated SAMs and the terminated SAMs can include —$CH_3$ and —OH groups, where the ALD growth on the surface does not occur on the mesh structure.

According to one aspect of the current embodiment, the mesh can be created by using an ALD passivator to the modified surface and providing an ALD-deposited sacrificial material layer to the ALD passivator, where islands are created thereon. The passivator is removed and an ALD layer is provided to the sacrificial layer, and the sacrificial layer is removed, where the mesh structure is created and the feature size of the mesh structure is managed according to hydrophobicity, formation time, composition of the SAM or temperature.

Figure 13:
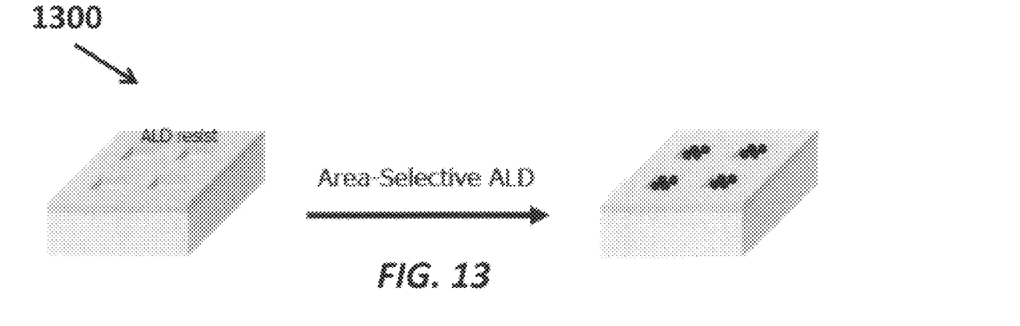
FIG. 13 shows the method of nanoparticle deposition can be combined with an area selective ALD process to produce an array of nanoparticle domains according to the current invention.

The method of nanoparticle deposition according to the current invention can be combined with an area selective ALD process to produce an array of nanoparticle domains. To produce larger scale (e.g micron size) spatial domains of nanoparticles, the substrate surface is modified in a two-dimensional pattern 1300. This aspect is illustrated in FIG. 13. Here, part of the surface is coated with an inhibitory layer, which completely blocks ALD, while other areas are modified in such a way that nanoparticle deposition is favored. Chemical modification of the substrate surface is combined with atomic layer deposition ALD according to the current invention. The area selective ALD process is an additive process in which material is deposited only where needed. According to the current invention, select well-defined regions are prepared for deposition while others are blocked from deposition. SAM-resists act as a barrier for blocking the ALD adsorption step on desired regions of a substrate surface, such as an oxidized Si wafer surface. ODTS 18-carbon chain SAMs can block the ALD of $HfO_2$ and $ZrO_2$ metal oxide gate dielectrics, particularly under conditions in which standard chemical oxide passivated substrates are highly effective templates for ALD film growth. The efficiency of deactivation depends strongly on the quality of the SAMs, and a high-quality, closely-packed ODTS film achieves near-complete blocking of the $HfO_2$ and $ZrO_2$ ALD process. The timescale over which the SAM becomes completely blocked can be many hours.

There exists a range of SAMs useful to selectively block the ALD process. These include, but are not limited to: thiols on Au, GaAs, Ge and InP, silanes on $SiO_2$ and other oxides, fatty acids on AgO and $Al_2O_3$, and phosphonates on $SiO_2$ and Au, thermally attached alkenes, photochemically attached alkenes, thermally attached alkynes or photochemically attached alkynes that are attached to the H-terminated surfaces.

Surface modification can completely inhibit ALD. For example, a well-packed, 18 carbon long chain SAM can block $HfO_2$ ALD for as many as 50 or more cycles. A SAM may be generated that acts as a complete ALD resist. Consequently, a bifunctionalized substrate can be constructed that contains both regions with well-packed, inhibitory SAMs, and regions with less packed SAMs that restrict the nucleation sites and allow for subsequent nanoparticle growth according to the current invention. Following ALD, the surface will contain domains of nanoparticles surrounded by areas of no growth. This larger scale patterning can be obtained by using photolithography or soft lithography, for example to define regions over which the nanoparticle deposition will occur.

Figure 14:
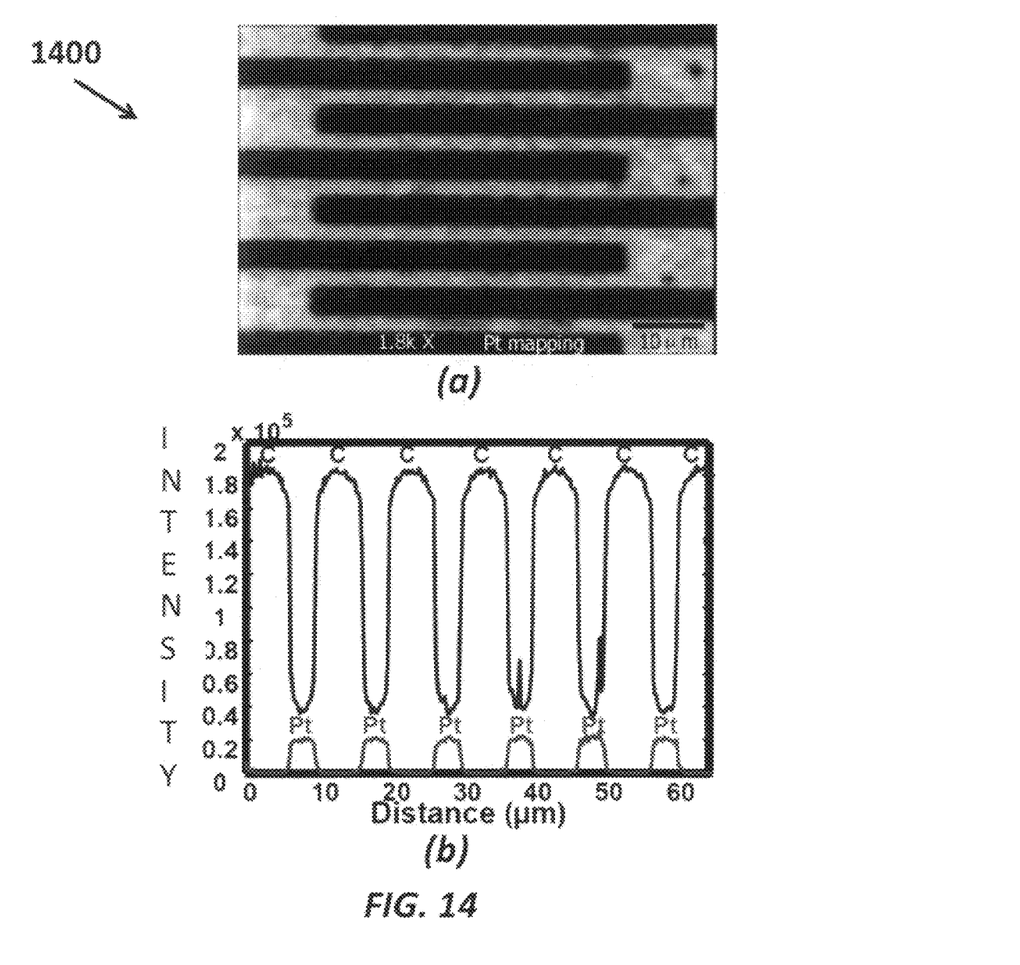
FIGS. 14(a)-14(b) show exemplary area selective ALD of Pt deposited, according to one embodiment of the invention.

An exemplary area selective ALD of Pt deposited 1400 as shown in FIGS. 14(*a*) and 14(*b*). As shown, the hydrosilylation chemistry forms an organic layer which deactivates the silicon surface, in contrast to the siloxane SAMs, leaving $SiO_2$ reactive. Area selective deposition using this chemistry is demonstrated on a patterned $SiO_2$/Si substrate, as shown in FIGS. 14(*a*) and 14(*b*). Here, a well-defined Pt pattern, which is commensurate with the underlying $SiO_2$ pattern, is formed. FIG. 14(*a*) shows AES analysis on patterned structure after area selective Pt ALD process where the Si is blocked by hydrosilylation (Pt elemental mapping). FIG. 14(*b*) shows AES defined line-scan. Hence, by choosing the proper surface functionalization, either positive or negative pattern transfer can be achieved with the area selective ALD process in the current invention. In a further aspect of the invention, the substrate surface may be patterned, where area selective ALD can be used to create a spatial pattern of domains of the nanoparticles.

There are a number of possible approaches for generating the bifunctionalized substrate according to the current invention. For example, one method is to microcontact print a long chain SAM (e.g. ODTS) in a pattern on the substrate, and dip the patterned substrate in a solution of a shorter chain SAM (e.g. OTS). The shorter chain SAM should functionalize only the regions that were not printed with ODTS, leaving areas, which are conducive to nanoparticle deposition (OTS) surrounded by blocked areas (ODTS). Alternatively, photo initiated hydrosilylation can be used to define the two regions. A hydride-terminated surface can be functionalized with organic chains via hydrosilylation only where irradiated lithographically with UV light. These hydrosilylated regions are inhibitory toward ALD, while the remaining H-terminated regions may be initiators of nanoparticle deposition as in the case of Pt.

With the current invention, nanoporous and other highly structured materials provide excellent substrates on which to disperse ALD deposited nanoparticles. In catalysis applications, the high surface area generated with such a multidimensional structure can greatly increase the number of active sites and overall yield of the catalyst compared to a two dimensional distribution. In addition, size and shape (steric) contributions to product selectivity, as demonstrated for zeolite-based catalysts, may also be achievable in the size-restricted pores of some nanoporous materials. For sensing applications, the distribution of nanoparticles filling a three-dimensional structure can provide an extremely high density of sensing units.

The ability to carry out ALD of nanoparticles onto extremely porous materials such as aerogels, anodic alumina or other porous media enables development of novel active materials for a number of applications using the method of the current invention. In porous media, the chemical composition of the matrix as well as the pore functionalization can be varied to effect the ALD nucleation process.

ALD is uniquely well suited for deposition within nanoporous materials because its layer-saturation reaction mechanism allows for deposition of material even within very high aspect ratio features. Good monodispersity has been obtained for copper nanoparticles ranging from 1-70 μm, with the average size controlled by the number of ALD cycles.

Aerogels are highly porous materials with extremely high surface areas (up to 1000 $m^2/g$). They are fabricated using the sol-gel method with supercritical drying. Aerogels can be formed out of a number of materials, including $TiO_2$, C, $SiO_2$, and Al(O)OH. Silica aerogels, among the most common form, are stable to ~650° C. Anodic alumina, on the other hand, is produced by electrochemical etching of aluminum. It can be fabricated with an ordered hexagonal pore structure with very well controlled aspect ratio (both pore length and diameter). For example, 60 μm thick anodic alumina discs with 20, 100, and 200 nm diameter pores can be purchased commercially.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example the degree of inhibition of the SAM against ALD can also be controlled by length of the tail on the SAM molecules, structure of the head and tail groups of the SAM, fluorination of the SAM, and other variations on the SAM. Other SAM systems that can be used, grouped by their head groups, include thiols on Au, GaAs, Ge and InP, silanes on $SiO_2$ and other oxides, fatty acids on AgO and $Al_2O_3$, and phosphonates on $SiO_2$ and Au. Other possible terminations of the tail groups of the SAM molecules include $CH_3$, $NH_2$, OH, SH, Cl, I and Br, etc. Other surface modifications are possible in addition to SAMs, including changing the hydrophobicity or hydrophilicity of the surface, the use of polymers, different molecular terminations at the surface obtained by chemical processing of the substrate, and fabrication of templated systems through microcontact printing and block copolymers. Block copolymers that can be used for the templating may contain, for example, polystyrene, PMMA, butadiene, PDMS, PEG, or polyvinylpyridine. In addition to nanoparticle synthesis, the methods described can be used to control the porosity of a continuous film by controlling the number of nucleation sites at the surface. In addition to nanoparticles, the methods described can also be used to grow other nanoscale objects, such as nanodots, nanowires, and nanorods. The method can be combined with area selective ALD to allow fabrication of nanoparticle domains, i.e. areas with nanoparticles and areas without nanoparticles. In area selective ALD, a patterned monolayer of long-chain molecules such as octadecyltrichlorosilane or polymer is formed on the substrate layer by soft lithography, for example via microcontact printing, replica molding, microtransfer molding, micromolding in capillaries, or solvent-assisted micromolding. The method can also be used to make "inverted" films where meshes of deposited film are created and small (down to nanosize) holes are left bare. Two possible approaches to achieve this feature are the following. One is to fabricate patterned SAM systems where ALD occurs on most of the SAM (e.g -on —OH terminated SAMs) but does not occur on inactive sites, such as pinholes, which are dispersed throughout the SAM. Another way is to use a sacrificial material. First, sacrificial material can be deposited by ALD onto an imperfect SAMs or polymer (any type of ALD inhibitor) to make islands, then the SAMs or polymers are removed. Then, deposition of a second material can be carried out by ALD in the areas where the SAMs or polymers were removed. Subsequent dissolution of the sacrificial material will result in a film distributed in a mesh structure. The feature size of the mesh structure can be controlled by the hole density of the SAMs or polymers, which are determined by the formation conditions. The invention can be combined with spatially controlled SAM formation to generate areas with different densities of nanoparticles or films deposited. These different densities can be varied continuously (by using a continuous gradient of SAM densities) or in a stepwise fashion (by incorporating abrupt changes of the SAM density). Different nanoparticle densities can also be achieved through different SAM formation times or by attaching SAMs of different chain lengths.

All such variations are considered to be within the scope and spirit of the present invention as defined by the following claims and their legal equivalents.

What is claimed:

1. A method of growing spatially-separated and size-controlled particles on substrate surfaces comprising:
   a. providing a modified layer to said substrate surface, using an ALD system;
   b. providing an ALD material for nanoparticle deposition; and
   c. inducing a Volmer-Weber growth method, wherein islands of said nanoparticles are formed on said surface, wherein said modified layer controls a number of nucleation sites on said surface, wherein controlling a number of ALD cycles limits an amount of deposited said material for discrete said nanoparticles, wherein said modified substrate layer comprises a mesh structure, wherein said mesh structure comprises bare nanosize openings in said modified substrate layer, whereas said openings comprise through-holes, pores or reactive sites, wherein said mesh is created by using microcontact printing to provide a pattern of terminated self-assembled monolayers (SAM's), wherein said terminated SAM's are selected from the group consisting of —$CH_3$ and —OH groups, wherein said ALD growth on said surface does not occur on said mesh structure.

2. The method of claim 1, wherein said mesh is created by:
   a. providing a passivator to said modified surface;
   b. providing an ALD-deposited sacrificial material layer to said passivator, wherein islands are created thereon;
   c. removing said passivator;
   d. providing a catalyst layer to said sacrificial layer; and
   e. removing said sacrificial layer, whereby said mesh structure is created, whereas a feature size of said mesh structure is controlled according to hydrophobicity, formation time, composition of said terminated SAM's or temperature.

* * * * *